(12) United States Patent
Hall et al.

(10) Patent No.: US 6,634,813 B2
(45) Date of Patent: Oct. 21, 2003

(54) ALL-OPTICAL BIT PHASE SENSING

(75) Inventors: Katherine L. Hall, Westford, MA (US); Kristin A. Rauschenbach, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/145,582

(22) Filed: May 14, 2002

(65) Prior Publication Data

US 2002/0163645 A1 Nov. 7, 2002

Related U.S. Application Data

(62) Division of application No. 08/615,428, filed on Mar. 14, 1996, now Pat. No. 6,388,753.

(51) Int. Cl.$^7$ .............................................. H04B 10/06
(52) U.S. Cl. ................................................... 398/213
(58) Field of Search ................................ 359/158, 173, 359/179, 187, 193–195; 385/24

(56) References Cited

U.S. PATENT DOCUMENTS

| | | | | |
|---|---|---|---|---|
| 4,484,144 A | * | 11/1984 | Nakagome et al. | 359/344 |
| 4,665,524 A | | 5/1987 | Cotter | 372/18 |
| 4,728,192 A | | 3/1988 | Shaw et al. | 356/350 |
| 4,943,788 A | | 7/1990 | Laws et al. | 331/11 |
| 4,949,051 A | | 8/1990 | Viola | 331/11 |
| 5,386,311 A | * | 1/1995 | Shields | 359/189 |
| 5,434,692 A | | 7/1995 | Auffret et al. | 359/158 |
| 5,535,001 A | | 7/1996 | Tajima | 356/345 |
| 5,548,433 A | * | 8/1996 | Smith | 359/158 |
| 5,552,926 A | | 9/1996 | Owa et al. | 359/326 |
| 5,633,855 A | | 5/1997 | Naito | 369/134 |
| 5,726,607 A | | 3/1998 | Brede et al. | 331/2 |

FOREIGN PATENT DOCUMENTS

| | | |
|---|---|---|
| EP | 0 476 968 A2 | 3/1992 |
| EP | 0 567 693 A1 | 11/1993 |

OTHER PUBLICATIONS

D.J. As et al., "Clock Recovery Based on a New Type of Selfpulsation in a 1.5 $\mu$m Two–Section InGaAsP–InP DFB Laser" Electronics Letter, 29(2):141–142 (1993).
L.E. Adams et al., "All–Optical Clock Recovery Using a Modelocked Figure Eight Laser with a Semiconductor Nonlinearity" Electronics Letters 30(20): 1696–1697 (1994).
P.E. Barnsley et al., "All–Optical Clock Recovery from 5 GB/s RZ Data Using a Self–Pulsating 1.56$\mu$m Laser Diode" IEEE Photonics Tech. Letters 3(10):952–945 (1991).
K.J. Blow et al., "Two–Wavelength Operation of the Nonlinear Fiber Loop Mirror", Optics Letters, 15)(4): 248–250 (1990).
S.P. Dijaili et al., "Timing Synchronization of a Passively Mode–Locked Dye Laser Using a Pulsed Optical Phase Lock Loop", Appl. Lett., 55(5):418–420 (1989).
A.D. Ellis et al., "All Optical Clock Recovery at Bit Rates Up to 40 GBit/s", Electronics Letters, 29(15):1323–1324 (1993).

(List continued on next page.)

Primary Examiner—Leslie Pascal
(74) Attorney, Agent, or Firm—Fish & Richardson P.C.

(57) ABSTRACT

All-optical bit phase sensors that utilize nonlinear interferometers are described. An all-optical bit phase sensor that utilizes an optical fiber and a detector optically coupled to the core of the fiber, perpendicular to the longitudinal direction of the core, is described. In addition, an electrooptic bit phase sensor that utilizes a semiconductor diode and an electrical detector electrically coupled to the active layer is described. Electrooptical and all-optical phase lock loops, optical processors, and optical networks that utilize these bit phase sensing are also described.

3 Claims, 8 Drawing Sheets

OTHER PUBLICATIONS

P. Ferro et al., "All–Optical Polarisation Differential Amplification with Birefringent Fibre" Electronics Letters 30(19):1616–1617 (1994).

K.L. Hall et al., "Gigahertz Clock Synchronization Using a Nolinear Optical Loop Mirror as an All–Optical Phase Comparator" 1995 Technical Digest Series, vol. 12, Conference Edition of Photonics in Switching, Salt Lake City, Utah, Mar. 15–17, 1995, pp. 61–63.

K.L. Hall et al., "Picosecond–Accuracy All–Optical Bit Phase Sensing Using a Nonlinear Optical Loop Mirror", IEEE Photonics Tech. Letters 7(8):935–938 (1995).

K.L. Hall et al., "Clock Recovery" Technical Digest for the Photonics in Switching Conference, Pth4–1, Salt Lake City, Utah, Mar. 15–17, 1995.

K. Inoue, "High–Speed All–Optical Gate Switching Experiment in a Fabry–Perot Semiconductor Laser Amplifier", Electronics Letters, 23(18):921–922 (1987).

E. Jahn et al., "40 Gbit/s All–Optical Demultiplexing Using a Monolithically Integrated Mach–Zehnder Interferometer with Semiconductor Laser Amplifiers", Electronic Letters, 31(21):1857–1858 (1995).

M. Jinno et al., "Optical Tank Circuits Used for All–Optical Timing Recovery", J. Quantum Electronics, 28(4):895–900 (1992).

M. Jinno et al., "All–Optical Extraction Using a 1.5 $\mu$m Self Pulsating Multielectrode DFB LD" Electronics Letters 24(23):1426–1227 (1988).

O. Kamatani et al., "Prescaled 6.3 GHz Clock Recovery for 50 GBit/s TDM Optical Signal with 50 GHz PLL Using Four–Wave Mixing in a Travelling–Wave Laser Diode Optical Amplifier" Electronics Letters 30:807 (1994).

S. Kawanishi et al., "Ultra–High Speed PLL–Type Clock Recovery Circuit Based on All–Optical Gain Modulation in Traveling–Wave Laser Diode Amplifier", J. of Lightwave Tech., 11(12):2123–2129 (1993).

L.F. Mollenauer et al., "Demonstration, Using Sliding–Frequency Guiding Filters, of Error–Free Soliton Transmission Over more Than 20 Mm at 10GBIT/s, Single Channel, and Over More Than 13 Mn at 20 Gbit/s in a Two–Channel WDM", Electronics Letters, 29(10):910–911 (1992).

J.D. Moores et al,, "Demonstration of Optical Switching by Means of Solitary Wave Collisions in a Fiber Ring Reflector, "*Optics Letters*, 16(3): 138–140 (1991).

B.P. Nelson et al., "Optical Sampling Oscilloscope Using Nonlinear Fibre Loop Mirror", Electronics Letters 27:204–205 (1991).

R.H. Pantell et al., "Analysis of Nonlinear Optical Switching in an Erbium–Doped Fiber", J. Lightwave Tech., 11(9):1416–1424 (1993).

N.S. Patel et al., "40 Gb/s Cascadable All–Optical Logic Using a Single Interferometer" Optical Fiber Conference, 1996.

N.S. Patel et al., "An All Fiber Optical Demultiplexer and XOR Gate", SPIE 2613:126–137.

N.S. Patel et al., "All–Optical Demultiplexer/Inverter Using a Semiconductor Laser Amplifier in a Single–Arm Interferometer" CLEO '96, Summaries of Papers Presented at the Conference on Lasers and Electro–Optics, vol. 9, 1996 Technical Digest Series.

D.M. Patrick et al., "20 Gbit/s All–Optical Clock Recovery Using Semiconductor Nonlinearity" Electronics Letters 30(2):151–152(1994).

J.P. Sokoloff et al., "A Terahertz Optical Asymmetric Demultiplexer (TOAD)", IEEE 5(7):787–790 (1993).

Eric A. Swanson et al., "40–GHz Pulse Train Generation Using Soliton Compression of a Mach–Zehnder Modulator Output", IEEE Photonics Technology Letters, 7(1):114–116 (1995).

K. Takayama et al., "3–2 GHz Operation of All–Optical Synchronization Circuit" Electronics Letters, 25:1739–1741 (1989).

J. Thogersen et al., "Multiphoton Absorption and Cooperative Upconversion Excitation in $Er^{3+}$—Doped Fibers" Optics Letters 18(3):197–199 (1993).

Zhi–Gong Wang et al., "19 GHz Monolithic Integrated Clock Recovery Using PLL and 0.3 $\mu$m Gate–Length Quantum–Well HEMTs" 1994 IEEE Int'l Solid–State Circuits Conference, pp. 188–199, Feb. 1994.

* cited by examiner

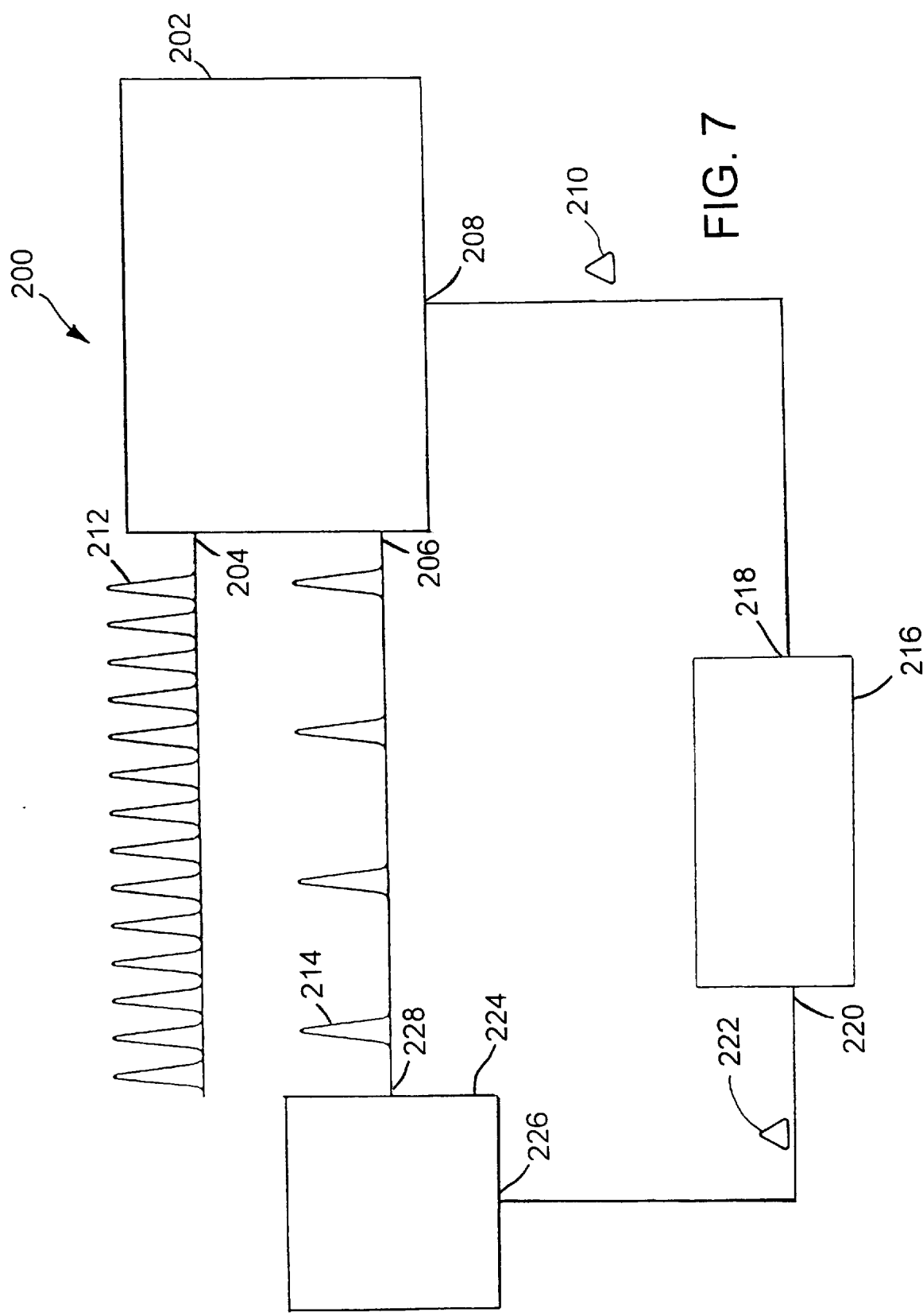

ALL-OPTICAL BIT PHASE SENSING

This application is a divisional application of U.S. application Ser. No. 08/615,428, filed Mar. 14, 1996, now U.S. Pat. No. 6,388,753.

This invention was made with government support under Grant Number MDA 972-92-J-1038 awarded by the Advanced Research Projects Agency. The government has certain rights in the invention.

FIELD OF THE INVENTION

The invention relates generally to the field of optical communications and optical signal processing. In particular, the invention relates to apparatus and methods for all-optical bit phase sensing and clock recovery.

BACKGROUND OF THE INVENTION

High-speed time division multiplexed (TDM) communication systems require high-speed clock recovery or clock synchronization. Multiple-user local area and metropolitan area TDM networks require high-speed clock recovery at each user access node. Typically, this clock recovery will involve locking a local clock to an incoming data or clock stream. Electrooptical and all-optical clock recovery and clock synchronization is advantageous because it has the potential for achieving higher speeds than all-electrical clock recovery and clock synchronization.

Several optical clock recovery and clock synchronization techniques have been demonstrated that utilize injection-locking of diodes, fibers, and lasers. Also, several high-speed optical clock recovery techniques have been demonstrated that utilize electrooptical phase lock loops (PLL) with bit phase sensors. An electrooptical phase lock loop has been demonstrated that utilizes nonlinear cross-correlation of two pulse streams to sense bit phase. Another electrooptical phase lock loop has been demonstrated that utilizes four wave mixing in a semiconductor to sense bit phase. These clock recovery techniques, however, have limited scalability in data and clock rates.

Commercially practical 100-Gb/s TDM communication systems require reliable, inexpensive, clock recovery techniques with sub-picosecond accuracy and a wide range of scalability in data and clock rates. Furthermore, it is desirable for the clock recovery technique to perform optical processing functions, such as multiplexing, demultiplexing, and Boolean logic functions, simultaneously with clock recovery in a single optical switch.

SUMMARY OF THE INVENTION

It is a principal object of this invention to provide an all-optical and an electrooptical bit phase sensor with at least sub-picosecond accuracy. It is another object of this invention to provide an electrooptical and an all-optical phase lock loop that utilizes these bit phase sensors. Other objects are to provide optical processors and optical networks that utilize these bit phase sensors.

A principle discovery is that nonlinear optical switches can be utilized to recover a clock signal with sub-picosecond accuracy. Another principle discovery is that a nonlinear optical switch can be utilized to perform simultaneous optical processing and clock recovery. Another principle discovery is that an all-optical phase lock-loop can be implemented using the optical output from an optical switch and an intensity dependent delay line. Another principle discovery is that nonlinear absorption in optical fibers and semiconductors can be utilized to recover clock signals with sub-picosecond accuracy.

Accordingly, the present invention features an all-optical bit phase sensor having a first optical beam input. A splitter, which is optically coupled to the first optical beam input, separates an input optical beam into a first and a second optical beam that propagates along a first and a second optical path, respectively. A nonlinear material, that forms an intensity dependent phase or transmission change, is positioned in the first optical path. The nonlinear material may also be disposed in the second optical path. The nonlinear material may be an optical fiber or a semiconductor amplifier.

A control optical beam input couples a control optical beam into the first optical path. The control beam causes nonlinear or transmission index changes in the nonlinear material. The input optical beam and the control beam may have substantially the same group velocities and thus may have substantially zero dispersive walk through. A recombiner recombines the first and the second optical beams into an output beam. The intensity of the output beam is proportional to the relative phase between the input optical beam and the control beam. A beam removal element may be positioned in the optical path to remove the control beam from the output beam. The beam removal element may comprise a filter, polarizer, or spatial multiplexer.

The present invention also features an all-optical bit phase sensor having a first optical beam input for accepting a first optical beam into an optical path. An optical differential delay element is disposed in the optical path which forms a second optical beam in the optical path by delaying a portion of the first optical beam in time. A nonlinear material is positioned in the optical path. The nonlinear material forms an intensity dependent phase or transmission change. The nonlinear material may be an optical fiber or a semiconductor amplifier.

A second input introduces a control beam into the optical path. The control beam causes nonlinear index or transmission changes in the nonlinear material. The control beam and the second optical beam may be pulse streams that are timed to overlap in the nonlinear material. The first optical beam and the control beam may have substantially the same group velocities and thus may have substantially zero dispersive walk through. A recombiner recombines the first and the second optical beams into an output beam. The intensity of the output beam is proportional to the relative phase between the first optical beam and the control beam. A beam removal element may be positioned in the optical path to remove the control beam from the output beam. The beam removal element may comprise a filter, polarizer, or spatial multiplexer.

The present invention also features a method of all-optical bit phase sensing. The method includes splitting an input optical beam into a first and a second optical beam that propagates along a first and a second optical path respectively. A nonlinear material is positioned in the first optical path. The control optical beam is coupled into the first optical path causing nonlinear index or transmission changes in the nonlinear material. The first and second optical beams are recombined into an output beam. The intensity of the output beam is proportional to the relative phase between the input optical beam and the control beam.

The present invention also features a second method of all-optical bit phase sensing. The method includes introducing a first optical beam into an optical path. A second optical beam is formed in the optical path by delaying a portion of the first optical beam in time. A nonlinear material is positioned in the optical path which has an intensity dependent phase or transmission change. A control beam is introduced into the optical path which causes nonlinear index or transmission changes in the nonlinear material. The first and the second optical beams are recombined into an output beam. The intensity of the output beam is proportional to the relative phase between the first optical beam and the control beam.

The present invention also features an electrooptic phase lock loop having a nonlinear interferometer. The nonlinear interferometer may comprise a Mach-Zehnder interferometer, a Sagnac interferometer, a Michelson interferometer, or a single arm interferometer. The nonlinear interferometer has a first optical beam input, a control optical beam input, and an optical beam output. An output optical beam of the interferometer has an intensity proportional to a phase difference between an input intensity modulated data stream input to the first optical beam input and a control clock stream input to the control optical beam input.

A feedback control network has an optical input optically coupled to the optical beam output of the interferometer and an electrical output. The electrical output of the feedback control network generates a signal in response to the intensity of the output optical beam of the interferometer. An optical clock stream generator includes an electrical input electrically coupled to the electrical output of the feedback control network and an optical output optically coupled to the control optical beam input of the nonlinear interferometer. The optical output of the optical clock stream generator produces an optical beam having a frequency that is proportional to the electrical output of the feedback control network. When the phase lock loop is closed, the output of the optical clock stream generator tracks the phase of the input intensity modulated data stream.

The feedback control network may include a detector, a differential amplifier, and a voltage controlled oscillator. The detector is optically coupled to the output optical beam of the nonlinear interferometer. The detector generates an output electrical signal proportional to the intensity of the output optical beam of the nonlinear interferometer. The differential amplifier has a first input electrically coupled to the output electrical signal of the detector, a second input electrically coupled to a bias voltage supply, and an output. The voltage controlled oscillator has an input electrically coupled to the output of the differential amplifier and an output electrically coupled to the electrical input of the optical clock stream generator. The output of the voltage controlled oscillator produces a signal having a frequency proportional to the magnitude of the output optical beam of the nonlinear interferometer.

The present invention also features an all-optical phase lock loop having a nonlinear interferometer. The nonlinear interferometer may comprises a Mach-Zehnder interferometer, a Sagnac interferometer, a Michelson interferometer, or a single arm interferometer. The nonlinear interferometer has a first optical beam input, a control optical beam input, and an optical beam output. An output optical beam of the interferometer has an intensity proportional to a phase difference between an input intensity modulated data stream input to the first optical beam input and a control clock stream input to the control optical beam input.

A feedback control network has an optical input optically coupled to the optical beam output of the interferometer and an optical output. The optical output of the feedback control network generates an optical beam in response to the intensity of the output optical beam of the interferometer. An optical clock stream generator includes an optical input optically coupled to the optical output of the feedback control network and an optical output optically coupled to the control optical beam input of the nonlinear interferometer. The optical output of the optical clock stream generator produces an optical beam having a frequency that is proportional to the optical output of the feedback control network. When the phase lock loop is closed, the output of the optical clock stream generator tracks the phase of the input intensity modulated data stream.

The present invention also features an optical processor that performs simultaneous clock recovery and processing functions. The optical processor includes a nonlinear interferometer that may comprise a Mach-Zehnder interferometer, a Sagnac interferometer, a Michelson interferometer, or a single arm interferometer. A first input of the nonlinear interferometer accepts an input optical beam and a second input accepts a control optical beam.

A first output of the interferometer generates a first output optical beam having an intensity that is functionally related to the input optical beam and the control optical beam. A second output of the interferometer generates a second optical beam that is also functionally related to the input optical beam and the control optical beam. The second output of the interferometer may be a portion of the first output of the interferometer. The second output of the interferometer may generate a demultiplex function or any Boolean logic function, such as an AND function, a NOT function, a XOR function, a OR function, a NOR function, or an INVERT function.

The optical processor also includes a feedback control network having an optical input optically coupled to the first output of the interferometer and an electrical output. The electrical output produces a signal having a magnitude functionally related to the intensity of the output of the interferometer. The optical processor also includes an optical beam generator having an electrical input electrically coupled to the electrical output of the feedback control network and an optical output optically coupled to the first or the second input of the nonlinear interferometer. The optical output of the optical beam generator produces an optical clock stream having a frequency that is proportional to the electrical output of the feedback control network.

Alternatively, the optical processor includes a feedback control network having an optical input optically coupled to the first output of the interferometer and an optical output. The optical output produces a signal having a magnitude functionally related to the intensity of the output of the interferometer. The optical beam generator includes an optical input optically coupled to the optical output of the feedback control network and an optical output optically coupled to the first or the second input of the nonlinear interferometer.

The present invention also includes an optical network including at least one network optical fiber and a clock recovery system that is optically coupled to at least one network optical fiber. The clock recovery system includes a nonlinear interferometer having a first input optically coupled to at least one network optical fiber, a second input, and an output. The clock recovery system includes a nonlinear interferometer that may comprise a Mach-Zehnder interferometer, a Sagnac interferometer, a Michelson interferometer, or a single arm interferometer.

The clock recovery system also includes an optical pulse generator having an electrical input and an optical output optically coupled to the first or the second input of the nonlinear interferometer. The clock recovery system also includes a feedback control network having an input optically coupled to the output of the nonlinear interferometer and having an output electrically coupled to the electrical input of the optical pulse generator. The frequency of an optical beam produced by the optical pulse generator is proportional to the output of the feedback control network.

Alternatively, the clock recovery system includes an optical pulse generator having an optical input and an optical output optically coupled to the first or the second input of the nonlinear interferometer. The clock recovery system includes a feedback control network having an input optically coupled to the output of the nonlinear interferometer and having an output optically coupled to the optical input of the optical pulse generator.

The feedback control network may include a detector, an amplifier, and a voltage-controlled oscillator. The detector is optically coupled to the output of the nonlinear interferometer and electrically connected to the amplifier. The amplifier is electrically connected to the voltage controlled oscillator. The voltage controlled oscillator is electrically connected to the optical pulse generator.

The present invention also features an all-optical bit phase sensor comprising an optical fiber having a core. The optical fiber may be an erbium doped fiber. The fiber includes a first and a second input that introduces a first and a second overlapping pulse stream, respectively, into the core. The first input and the second input may be optically coupled to an end of the optical fiber. The all-optical bit phase sensor also includes a detector positioned perpendicular to a longitudinal direction of the core and optically coupled to the core.

The present invention also features an optical network comprising at least one network optical fiber and a clock recovery system that is optically coupled to the network optical fiber. The clock recovery system includes an optical fiber having a core, a first input coupled to at least one network optical fiber, and a second input. The optical fiber having the core may be a erbium doped fiber.

The first and second inputs introduce a first and a second overlapping optical pulse stream into the core. The clock recovery system also includes an optical pulse generator optically coupled to the second input that generates the second optical pulse stream. The clock recovery system also includes a detector that is optically coupled to the core of the network optical fiber. In addition, the clock recovery system includes a feedback control network having an input optically coupled to the output of the detector and having an output electrically coupled to the optical pulse generator.

The present invention also features a third method of all-optical bit phase sensing. The method includes providing an optical fiber having a core, a first input, and a second input. A first and a second overlapping pulse stream are introduced into the first and the second input of the optical fiber, respectively. Light emitted through the core is detected.

The present invention also features an electrooptical bit phase sensor comprising a semiconductor diode having an active layer. The diode includes a first and a second input that introduce a first and a second overlapping pulse stream, respectively, into the active layer. The bit phase sensor also includes a voltage detector that is electrically coupled to the active layer. The detector measures an output electrical signal having a voltage proportional to the phase difference of the first and the second overlapping pulse stream.

The present invention also features a method of electrooptical bit phase sensing. The method includes providing a semiconductor diode having an active layer, a first input, and a second input. A first and a second overlapping pulse stream are introduced into the first and the second input of the active layer, respectively. A detector measures an output electrical signal that has a voltage proportional to the first and a second overlapping pulse stream.

The present invention also features an optical network comprising at least one network optical fiber and a clock recovery system that is optically coupled to at least one network optical fiber. The clock recovery system includes a semiconductor diode having an active layer. The diode also includes a first and a second input that introduces a first and a second overlapping pulse stream, respectively, into the active layer.

The clock recovery system also includes an optical pulse generator optically coupled to the second input that generates the second optical pulse stream. The clock recovery system also includes a voltage detector having an electrical input electrically coupled to the active layer. In addition, the clock recovery system includes a feedback control network having an input electrically coupled to the output of the detector and having an output electrically coupled to the optical pulse generator.

BRIEF DESCRIPTION OF THE DRAWINGS

This invention is described with particularity in the appended claims. The above and further advantages of this invention may be better understood by referring to the following description taken in conjunction with the accompanying drawings, in which:

FIG. 7 is an all-optical phase lock loop that incorporates an all-optical bit phase sensor having a nonlinear interferometer.

DETAILED DESCRIPTION

Figure 1:
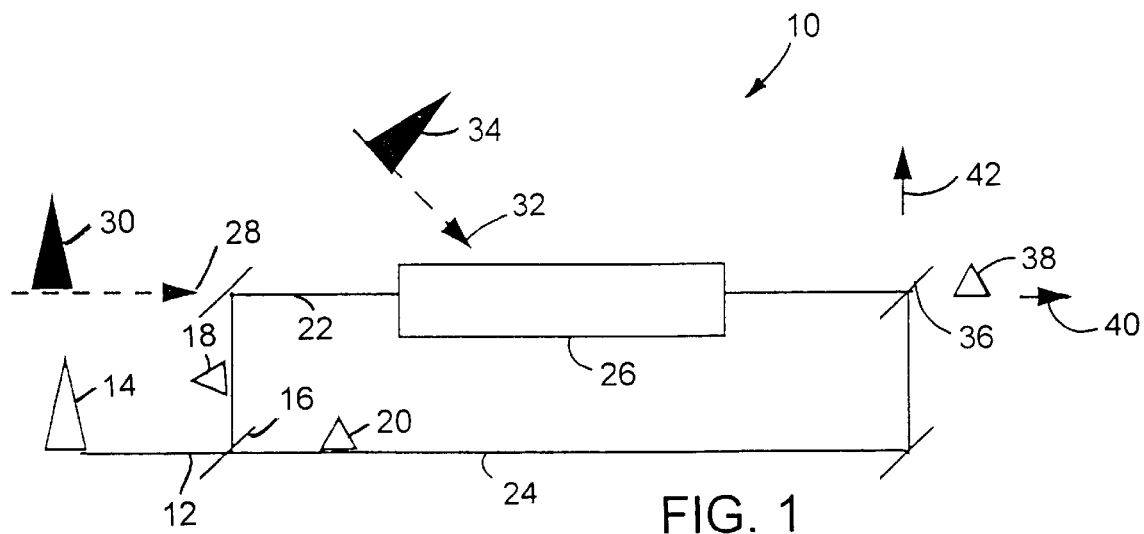
FIG. 1 is a schematic diagram of an all-optical bit phase sensor in a Mach-Zehnder interferometer configuration that embodies this invention.

FIG. 1 is a schematic diagram of an all-optical bit phase sensor 10 in a Mach-Zehnder interferometer configuration that embodies this invention. The bit phase sensor 10 includes a first optical beam input 12 for introducing an input optical beam 14. A splitter 16 is optically coupled to the first optical beam input 12. The splitter 16 separates the input optical beam 14 into a first 18 and a second optical beam 20 which propagates along a first 22 and a second optical path 24, respectively.

A nonlinear material 26 is positioned in the first optical path 22 which creates an intensity dependent phase or a transmission change. A second nonlinear material (not shown) may be positioned in the second optical path 24. The nonlinear material 26 may be an optical fiber (not shown) or a semiconductor amplifier (not shown).

A control optical beam input 28 couples a control optical beam 30 into the first optical path 22. Alternatively, a control optical beam input 32 couples a control optical beam 34 directly into the nonlinear material 26. The control beam 30, 34 causes nonlinear index or transmission changes in the nonlinear material 26. The input optical beam 14 and the control beam 30, 34 may have substantially the same group velocities and thus may have substantially zero dispersive walk through.

A recombiner 36 recombines the first 18 and the second 20 optical beams into an output beam 38. The output beam 38 may be transmitted out of a first port 40 or a second port 42 or some combination of the first 40 and the second 42 ports. The intensity of the output beam 38 is proportional to the relative phase between the input optical beam 14 and the control beam 30, 34. A beam removal element (not shown) may be positioned in the optical path after the nonlinear material 26 to remove the control beam 30, 34 from the output beam 38. The beam removal element may be optically coupled to the first 40 and the second port 42. The beam removal element may comprise either a filter (not shown), a polarizer (not shown), or a spatial multiplexer (not shown).

Figure 2:
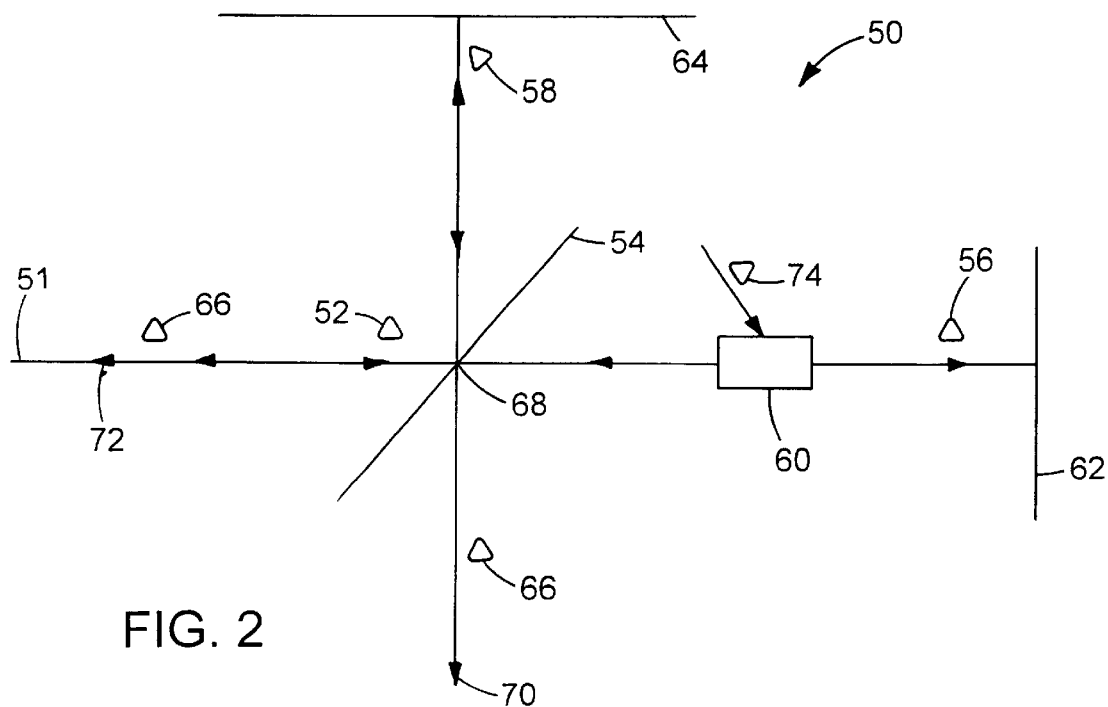
FIG. 2 is a schematic diagram of an all-optical bit phase sensor in a Michelson interferometer configuration that embodies this invention.

FIG. 2 is a schematic diagram of an all-optical bit phase sensor 50 in a Michelson interferometer configuration that embodies this invention. The bit phase sensor includes a first optical beam input 51 for introducing an input optical beam 52. The input optical beam 52 is coupled to a splitter 54 that splits the input optical beam 52 into a first 56 and a second optical beam 58. The first optical beam 56 propagates through a nonlinear material 60 and is reflected by a first mirror 62. A control optical beam 74 is coupled to the nonlinear material 60. The second optical beam 58 is reflected by a second mirror 64. The first 56 and second optical beam 58 are recombined to form an output optical beam 66 by a recombiner 68 that may be the splitter 54. The output optical beam 66 may be transmitted out of a first 70 or a second port 72 or some combination of the first 70 and the second port 72.

The intensity of the output beam 66 is proportional to the relative phase between the input optical beam 52 and the control optical beam 74. A beam removal element (not shown) may be positioned in the optical path after the nonlinear material 60 to remove the control optical beam 74 from the output beam 66. The beam removal element may be optically coupled to the first 70 and the second port 72. The beam removal element may comprise a filter (not shown), polarizer (not shown), or spatial multiplexer (not shown).

Figure 3:
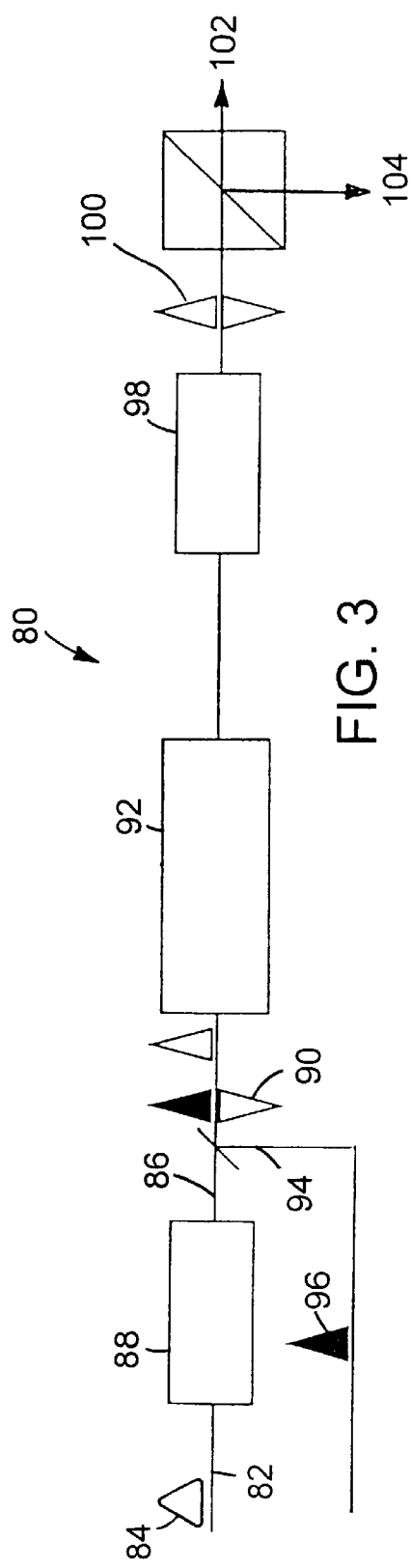
FIG. 3 is a schematic diagram of an all-optical bit phase sensor in a single arm interferometer configuration that embodies this invention.

FIG. 3 is a schematic diagram of an all-optical bit phase sensor 80 in a single arm interferometer configuration that embodies this invention. The single arm interferometer (SAI) configuration is also known as an ultrafast nonlinear interferometric switch. The SAI is a self-balanced interferometer that is resistant to parasitic path length changes that naturally occur in two-arm interferometers. The SAI is highly stable because the signal and reference pulses travel down the same path.

Generally, the SAI operates by splitting an input signal pulse into two polarizations and delaying one polarization with respect to the other by a small amount. A control pulse is timed so as to overlap with the delayed polarization pulse, but also as to not interact with the polarization reference pulse. The reference and delayed polarization pulses are recombined and passed through a polarizer. The resulting interference pattern is a function of the phase shift or transmission change induced in the delayed beam by the control intensity.

The all-optical bit phase sensor 80 includes a first optical beam input 82 for accepting a first optical beam 84 into an optical path 86. An optical differential delay element 88 is disposed in the optical path 86. The optical differential delay element 88 may be a polarization sensitive delay element (not shown). The differential delay element 88 forms a second optical beam 90 in the optical path 86 by delaying a portion of the first optical beam 84 in time. A nonlinear material 92 is positioned in the optical path 86. The nonlinear material 92 forms an intensity dependent phase or transmission change. The nonlinear material 92 may be an optical fiber (not shown) or a semiconductor amplifier (not shown).

A second input 94 introduces a control beam 96 into the optical path 86. The control beam 96 causes nonlinear index transmission changes in the nonlinear material 92. Alternatively, a control beam (not shown) may be coupled directly to the nonlinear material 92. The control beam 96 and the second optical beam 90 may be pulse streams that are timed to overlap in the nonlinear material 92. The first optical beam 84 and the control beam 96 may have substantially the same group velocities and thus may have substantially zero dispersive walk through.

A recombiner 98 recombines the first 84 and the second optical beams 90 into an output beam 100. The output beam 100 may be transmitted out of a first port 102 or a second port 104 or some combination of the first 102 and the second 104 ports. The intensity of the output beam 100 is proportional to the relative phase between the first optical beam 84 and the control beam 96. A beam removal element (not shown) may be positioned in the optical path after the nonlinear material 92 to remove the control beam 96 from the output beam 100. The beam removal element may be optically coupled to the first 102 or the second port 104. The beam removal element may comprise a filter (not shown), polarizer (not shown), or spatial multiplexer (not shown).

Figure 4:
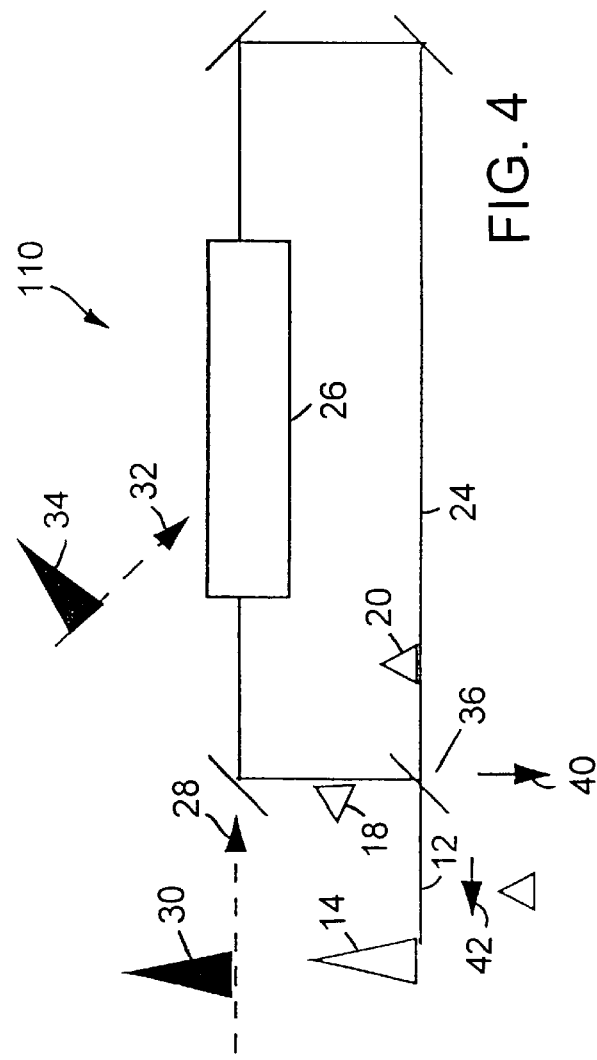
FIG. 4 is a schematic diagram of an all-optical bit phase sensor in a Sagnac interferometer configuration that embodies this invention.

FIG. 4 is a schematic diagram of an all-optical bit phase sensor 110 in a Sagnac interferometer configuration that embodies this invention. The Sagnac configuration is identical to the Mach-Zehnder configuration except for the positioning of the recombiner 36. In the Sagnac configuration, the recombiner 36 is positioned at the first optical beam input 12.

Figure 5A:
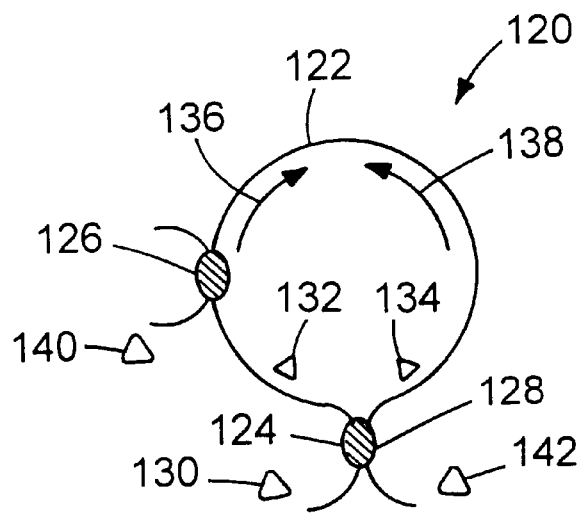
FIG. 5a illustrates an all-optical bit phase sensor configured as a fiber Sagnac interferometer.

FIG. 5a illustrates an all-optical bit phase sensor 120 configured as a fiber Sagnac interferometer. The bit phase sensor 120 includes a fiber loop 122, an input coupler 124, a control coupler 126, and an output coupler 128. The input coupler 124 couples an input optical beam 130 into the fiber loop 122 and splits the input optical beam 130 into a first 132 and a second counter propagating beam 134 which follow a first 136 and second optical path 138, respectively. The control coupler 126 couples a control optical beam 140 into the fiber loop 122. The control coupler 126 does not need to be a separate port but must couple the control optical beam 140 into only one of the first 136 or second optical path 138. The output coupler 128 combines the first 132 and the second counter propagating beam 134 into a single output beam 142.

The input coupler 124 and the control coupler 126 may be polarization and wavelength independent. In that case, a filter (not shown) or a polarizer (not shown) may select switched output pulses. The input coupler 124 may also be polarization sensitive. In that case, a TE input optical beam may be split equally into each of the first 132 and second counter propagating beam 134 and a TM input optical beam may be coupled differentially to either the first 136 or the second optical path 138.

Figure 5B:
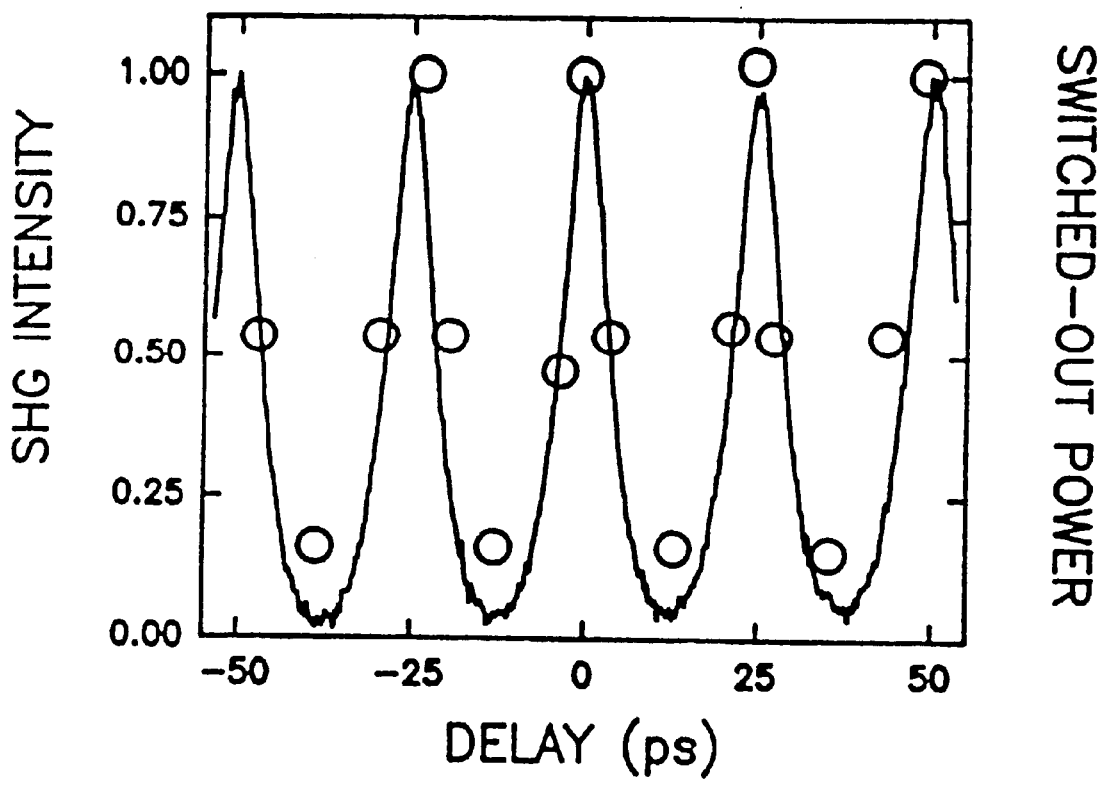
FIG. 5b presents data illustrating output power of the all-optical bit phase sensor as a function of delay between the input intensity modulated data stream and the control clock stream.

FIG. 5b presents data illustrating the output power of the all-optical bit phase sensor 120 in the fiber Sagnac interferometer configuration as a function of delay between an input intensity modulated data stream input to the input coupler 124 and a control clock stream input to the control coupler 126. The accuracy of the bit phase sensing is limited mainly by the width of the optical pulses. The bit phase sensor is most accurate when walk-through between the first optical beam and the control clock stream is minimized. This is achieved by choosing center wavelengths for the optical pulses that are equally spaced around the zero dispersion wavelength of the fiber.

A method of all-optical bit phase sensing includes splitting an input optical beam into a first and a second optical beam that propagate along a first and a second optical path respectively. A nonlinear material is positioned in the first optical path. The control optical beam is coupled into the first optical path causing nonlinear index or transmission changes in the nonlinear material. The first and second optical beams are recombined into an output beam. The intensity of the output beam is proportional to the relative phase between the input optical beam and the control beam.

A second method of all-optical bit phase sensing includes introducing a first optical beam into an optical path. A second optical beam is formed in the optical path by delaying a portion of the first optical beam in time. A nonlinear material is positioned in the optical path which has an intensity dependent phase or transmission change. A control beam is introduced into the optical path which causes nonlinear index or transmission changes in the nonlinear material. The first and the second optical beams are recombined into an output beam. The intensity of the output beam is proportional to the relative phase between the first optical beam and the control beam.

Figure 6:
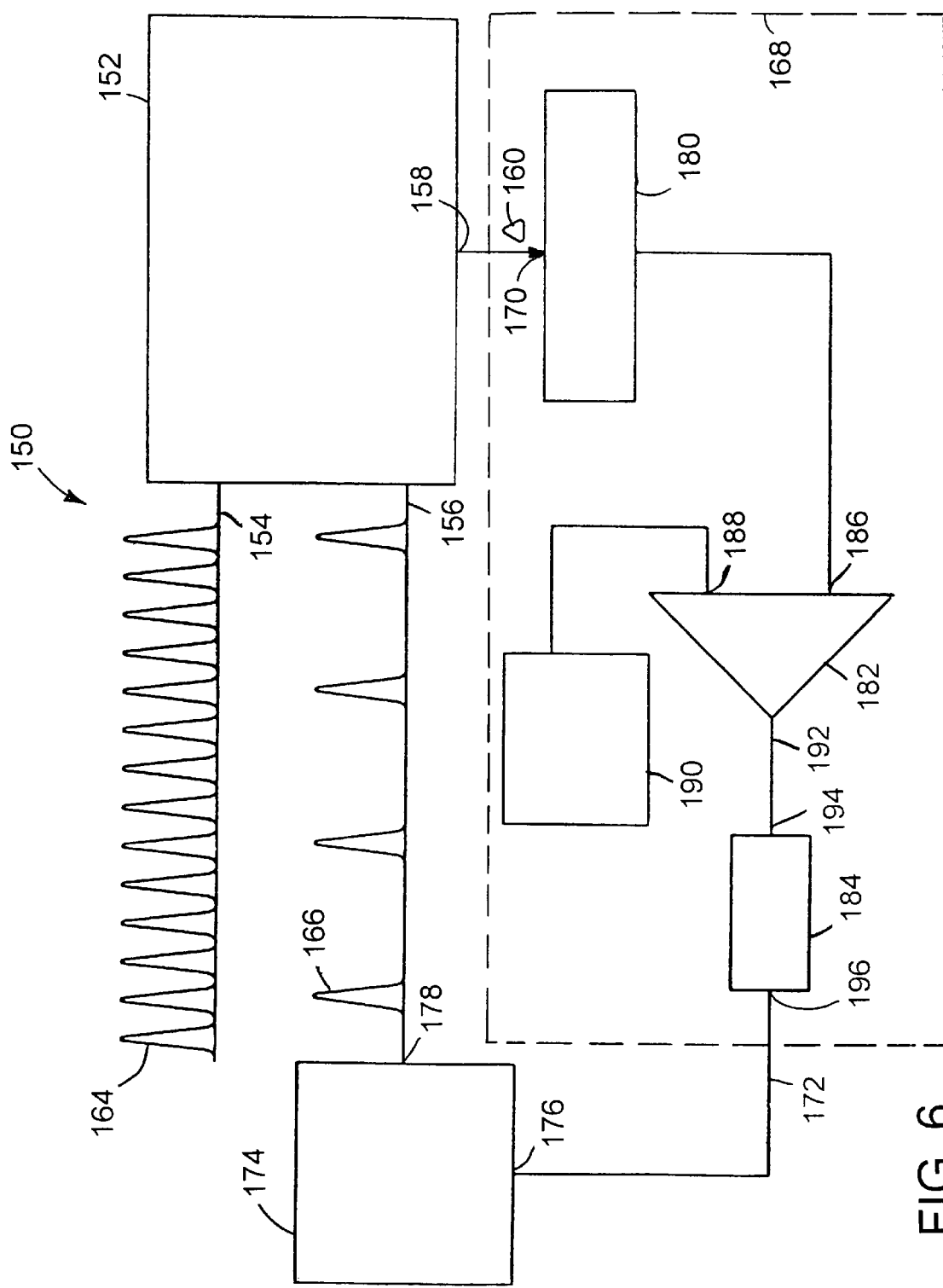
FIG. 6 is an electrooptic phase lock loop that incorporates an all-optical bit phase sensor having a nonlinear interferometer.

FIG. 6 is an electrooptic phase lock loop 150 that incorporates an all-optical bit phase sensor having a nonlinear interferometer 152. The nonlinear interferometer 152 may comprise any of numerous interferometers such as a Mach-Zehnder interferometer, a Sagnac interferometer, a Michelson interferometer, or a single arm interferometer. The nonlinear interferometer 152 has a first optical beam input 154, a control optical beam input 156, and an optical beam output 158. An output optical beam 160 of the interferometer 152 has an intensity proportional to a phase difference between an input intensity modulated data stream 164 input to the first optical beam input 154 and a control clock stream 166 input to the control optical beam input 156.

A feedback control network 168 has an optical input 170 optically coupled to the optical beam output 158 of the interferometer 152 and an electrical output 172. The electrical output 172 of the feedback control network 168 generates a signal in response to the intensity of the output optical beam 160 of the interferometer 152. An optical clock stream generator 174 includes an electrical input 176 electrically coupled to the electrical output 172 of the feedback control network 168 and an optical output 178 optically coupled to the control optical beam input 156 of the nonlinear interferometer 152. The optical output 178 of the optical clock stream generator 174 produces the control clock stream 166 which has a frequency that is proportional to the electrical output 172 of the feedback control network 168.

Numerous feedback control networks known in the art may be utilized. For example, the feedback control network 168 may include a detector 180, a differential amplifier 182, and a voltage controlled oscillator 184. The detector 180 is optically coupled to the output optical beam 160 of the nonlinear interferometer 152. The detector 180 generates an output electrical signal proportional to the intensity of the output optical beam 160 of the nonlinear interferometer 152.

The differential amplifier 182 has a first input 186 electrically coupled to the output electrical signal of the detector 180, a second input 188 electrically coupled to a bias voltage supply 190 and an output 192. The voltage controlled oscillator 184 has an input 194 electrically coupled to the output 192 of the differential amplifier 182 and an output 196 electrically coupled to the electrical input 176 of the optical clock stream generator 174.

The output 196 of the voltage controlled oscillator 184 produces a signal having a frequency proportional to the magnitude of the output optical beam 160 of the nonlinear interferometer 152. The bias voltage supply 190 controls the response of the feedback control network 168. The bias voltage supply 190 may be adjusted so that the feedback control network 168 has a linear response. Numerous other amplifiers, known in the art which condition the output electrical signal of the detector 180, may be utilized.

FIG. 7 is an all-optical phase lock loop 200 that incorporates an all-optical bit phase sensor having a nonlinear interferometer 202. The all-optical phase lock loop 200 is desirable because there are no electronics that restrict the bandwidth of the optical system. The nonlinear interferometer 202 may comprise a Mach-Zehnder interferometer, a Sagnac interferometer, a Michelson interferometer, or a single arm interferometer. The nonlinear interferometer 202 has a first optical beam input 204, a control optical beam input 206, and an optical beam output 208. An output optical beam 210 of the interferometer 202 has an intensity proportional to a phase difference between an input intensity modulated data stream 212 input to the first optical beam input 204 and a control clock stream 214 input to the control optical beam input 206.

A feedback control network 216 has an optical input 218 optically coupled to the optical beam output 208 of the interferometer 202 and an optical output 220. The optical output 220 of the feedback control network 216 generates an optical beam 222 in response to the intensity of the output optical beam 210 of the interferometer 202. The feedback control network 216 may produce a variable optical delay where the delay is functionally related to the output optical beam 210 of the interferometer 202.

An optical clock stream generator 224 includes an optical input 226 optically coupled to the optical output 220 of the feedback control network 216 and an optical output 228 optically coupled to the control optical beam input 206 of the nonlinear interferometer 202. The optical output 228 of the optical clock stream generator 224 produces the control clock stream 214 which has a frequency that is proportional to the optical beam 222 generated by the feedback control network 216. Such an optical output may be produced by numerous methods that are well known in the art. For example, the optical clock stream generator 226 may be injection locked or optically active mode-locked to the optical output 220 of the feedback control network 216.

Figure 8A:
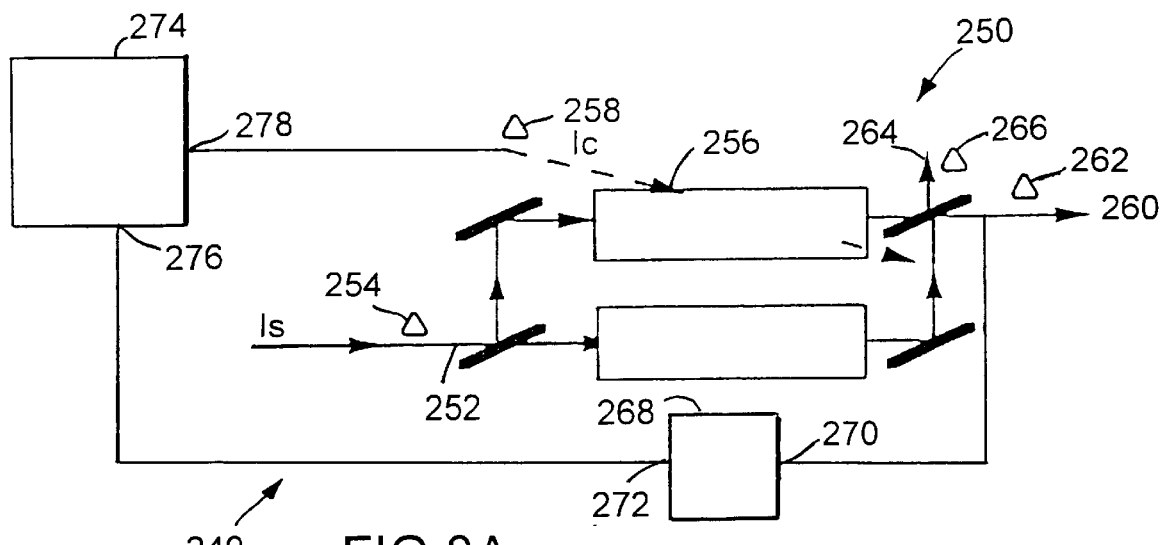
FIG. 8a is a schematic diagram of an optical processor that performs simultaneous clock recovery and processing functions.

FIG. 8a illustrates an optical processor 240 comprising a nonlinear interferometer 250. A Mach-Zehnder nonlinear interferometer configuration is illustrated in FIG. 8a, but a Sagnac, Michelson, or a single arm nonlinear interferometer can also be utilized. A first input 252 of the nonlinear interferometer 250 accepts an input optical beam 254 and a second input 256 accepts a control optical beam 258. The input optical beam 254 may be a modulated pulse stream.

A first output 260 of the interferometer 250 generates a first output optical beam 262 having an intensity that is functionally related to the input optical beam 254 and the control optical beam 258. A second output 264 of the interferometer 250 generates a second optical beam 266 that is also functionally related to the input optical beam 254 and the control optical beam 258. In another embodiment, the second output 264 of the interferometer 250 may be a portion of the first output 260 of the interferometer 250. The second output 264 of the interferometer 250 may generate a demultiplex function or any Boolean logic function such as an AND function, a NOT function, a XOR function, a OR function, a NOR function, or an INVERT function. Such functions may be utilized, alone or in combination, to perform gating, address recognition, flow control, or buffering.

The optical processor 240 also includes a feedback control network 268 having an optical input 270 optically coupled to the first output 260 of the interferometer 250 and an electrical output 272. The electrical output 272 produces a signal having a magnitude functionally related to the intensity of the output of the interferometer 250. The optical processor 240 also includes an optical beam generator 274 having an electrical input 276 electrically coupled to the electrical output 272 of the feedback control network 268 and an optical output 278 optically coupled to the second input 256 of the nonlinear interferometer 250. Alternatively, the optical output 278 of the optical beam generator 274 may be optically coupled to the first input 252 of the nonlinear interferometer 250 and the input optical beam 254 may be coupled to the second input 256. The optical output 278 of the optical beam generator produces an optical clock stream having a frequency that is proportional to the electrical output 272 of the feedback control network 268.

Alternatively, the feedback control network 268 may have an optical output that produces a signal having a magnitude functionally related to the intensity of the output 262 of the interferometer 250. The optical processor 240 may include an optical beam generator having an optical input optically coupled to the optical output of the feedback control network. The optical output 278 of the optical beam generator 274 produces an optical clock stream having a frequency that is proportional to the optical output of the feedback control network 268. The optical output 260 may simultaneously generate demultiplexing and Boolean logic functions. Such an output is desirable because it reduces the number of optical elements which are necessary to perform synchronization and optical processing and thus reduces the complexity and cost of the system.

Figure 8B:
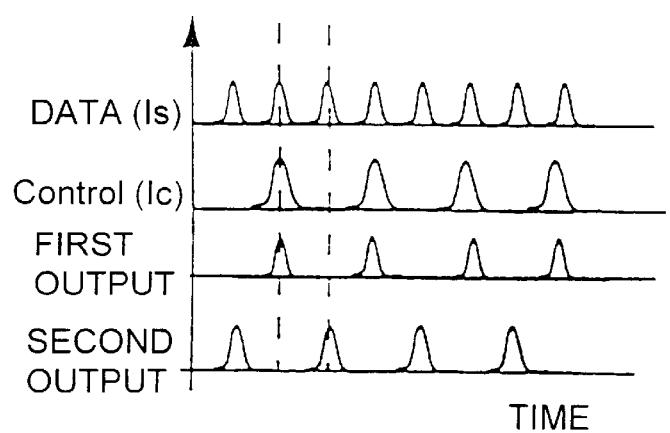
FIG. 8b presents data illustrating Boolean logic and demultiplex functions performed simultaneously by the optical processor.

FIG. 8b presents data illustrating possible Boolean logic and demultiplex functions performed by the optical processor 240. The first output port 260 illustrates a demultiplex function of the input optical beam 254 and the control optical beam 258. The second output port 264 illustrates and AND of the input optical beam 254 and NOT control optical beam 258.

Figure 9:
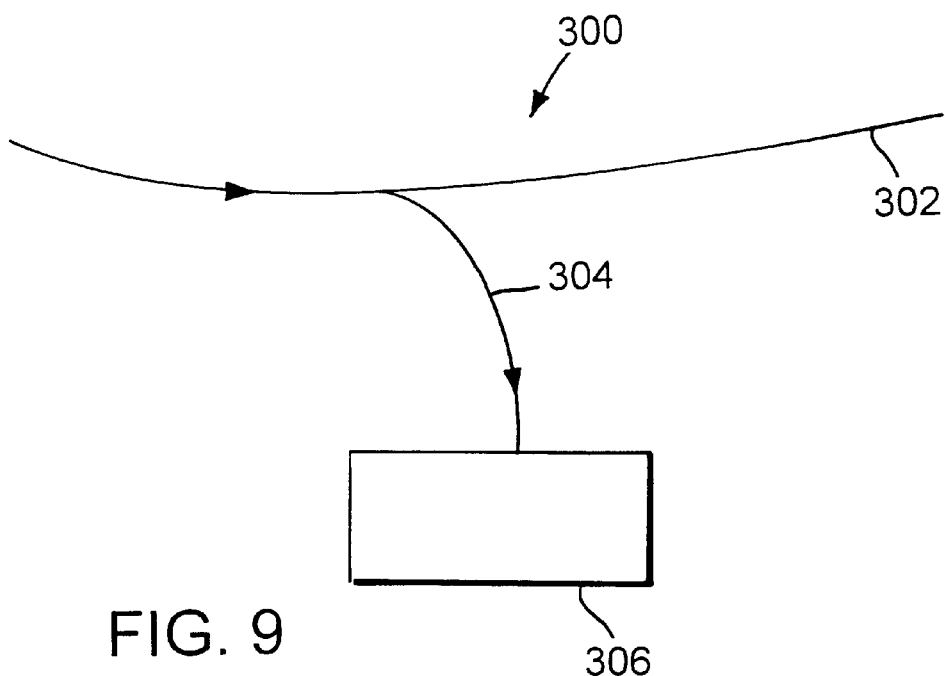
FIG. 9 illustrates an optical network including at least one network optical fiber and a clock recovery system that is optically coupled to at least one network optical fiber.

FIG. 9 illustrates an optical network 300 including at least one network optical fiber 302 and a clock recovery system 306 that is optically coupled to the network optical fiber 302 by a tap optical fiber 304. The network optical fiber 302 may contain modulated data or a distributed clock or both. The clock recovery system may generate a local clock stream that is synchronized to the modulated data. The local clock stream may be used to time a local demultiplexer for taking data off the network. The local clock stream may also be used for timing a local data generator that generates data to be inserted on the optical network. In addition, the local clock stream may be used to time local logic processes for address recognition and other functions.

The clock recovery system 306 includes a nonlinear interferometer having a first input optically coupled to at least one network optical fiber, a second input, and an output. The clock recovery system includes a nonlinear interferometer that may comprise a Mach-Zehnder interferometer, a Sagnac interferometer, a Michelson interferometer, or a single arm interferometer.

The clock recovery system also includes an optical pulse generator having an electrical input and an optical output optically coupled to the second input of the nonlinear interferometer. The clock recovery system also includes a feedback control network having an input optically coupled to the output of the nonlinear interferometer and having an output electrically coupled to the electrical input of the optical pulse generator. The frequency of an optical beam produced by the optical pulse generator is proportional to the output of the feedback control network.

The feedback control network may include a detector, an amplifier, and a voltage-controlled oscillator. The detector is optically coupled to the output of the nonlinear interferometer and electrically connected to the amplifier. The amplifier is electrically connected to the voltage controlled oscillator. The voltage controlled oscillator is electrically connected to the optical pulse generator.

Figure 10:
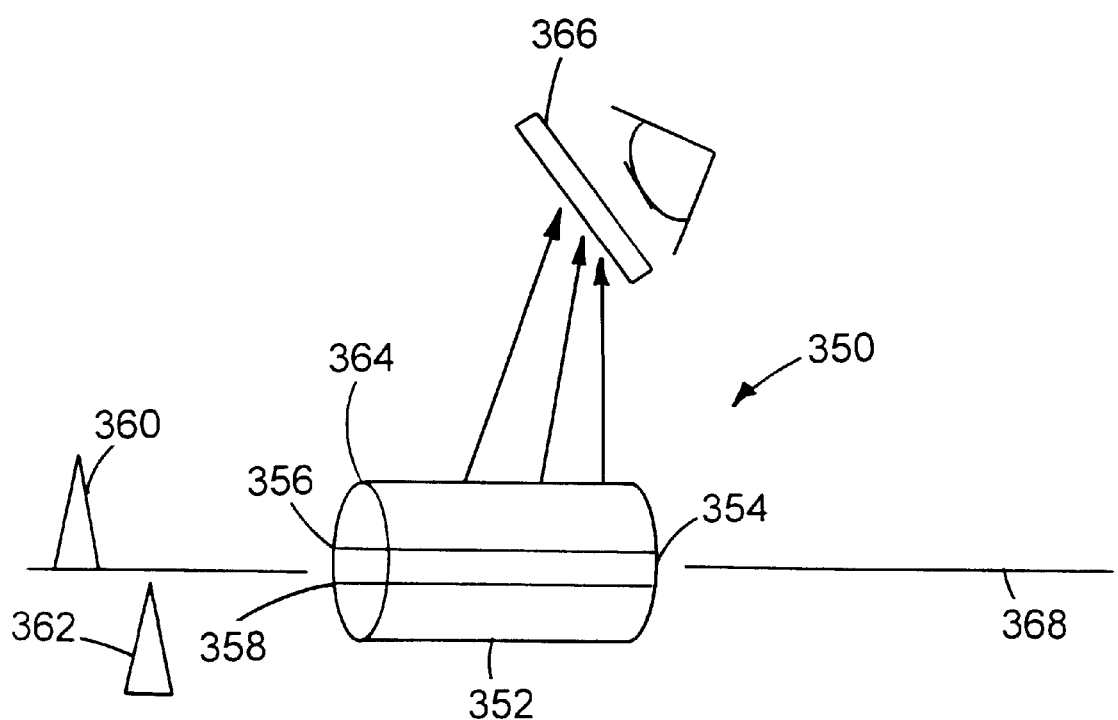
FIG. 10 illustrates an all-optical bit phase sensor comprising an optical fiber having a core.

FIG. 10 illustrates an all-optical bit phase sensor 350 comprising an optical fiber 352 having a core 354. The optical fiber 352 may be an erbium doped fiber. The optical fiber 352 includes a first 356 and a second input 358 that introduces a first 360 and a second overlapping pulse stream 362, respectively into the core 354. The first input 356 and the second input 358 may be optically coupled to an end 364 of the optical fiber 352. The all-optical bit phase sensor 350 also includes a detector 366 positioned perpendicular to a longitudinal direction 368 of the core 354 and optically coupled to the core 354.

The present invention also features a third method of all-optical bit phase sensing. The method includes providing an optical fiber having a core, a first input, and a second input. A first and a second overlapping pulse stream are introduced into the first and the second input of the optical fiber, respectively. A resultant output spectrum contains a variety of spectral components with intensities proportional to the correlation function of the two pulses. The spectral components are not guided and thus radiate radially from the fiber. Light emitted from the core is detected.

An optical network, similar to FOG. 9, including at least one network optical fiber and a clock recovery system may be constructed where the clock recovery system comprises an optical fiber having a core that is optically coupled to the network optical fiber. The clock recovery system includes an optical fiber having a core, a first input coupled to at least one network optical fiber, and a second input. The optical fiber having the core may be a erbium doped fiber.

The first and second input introduce a first and a second overlapping optical pulse stream into the core. The clock recovery system also includes an optical pulse generator optically coupled to the second input that generates the second optical pulse stream. The clock recovery system also includes a detector that is optically coupled to the core of the network optical fiber. In addition, the clock recovery system includes a feedback control network having an input coupled to the output of the detector and having an output coupled to the optical pulse generator. The feedback control network may have an electrical or an optical output.

Figure 11:
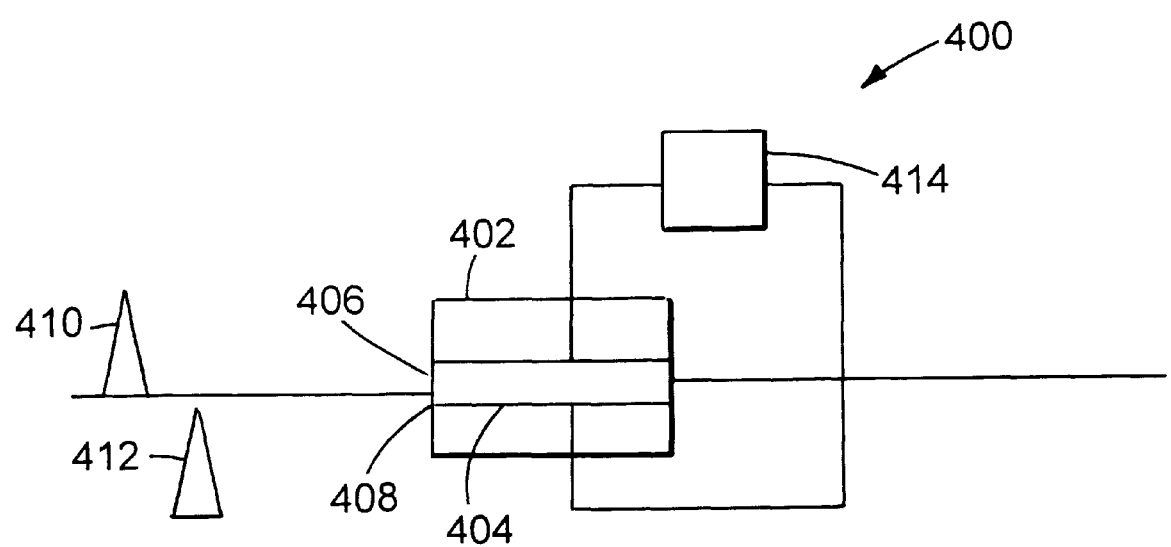
FIG. 11 illustrates an all-optical bit phase sensor comprising a semiconductor diode having an active layer and a detector that is electrically coupled to the active layer.

FIG. 11 illustrates an electrooptical bit phase sensor 400 comprising a semiconductor diode 402 having an active layer 404. The diode 402 includes a first 406 and a second input 408 that introduce a first 410 and a second overlapping pulse stream 412, respectively into the active layer 404. The bit phase sensor 400 also includes a voltage detector 414 that is electrically coupled to the active layer 404. The detector 414 measures an output electrical signal having a voltage proportional to the first 410 and the second overlapping pulse stream 412.

An optical network, similar to FIG. 9, including at least one network optical fiber and a clock recovery system. The clock recovery system comprises a semiconductor diode having an active layer that is optically coupled to the network optical fiber. The diode also includes a first and a second input that introduces a first and a second overlapping pulse stream, respectively into the active layer. The clock recovery system also includes an optical pulse generator optically coupled to the second input that generates the second optical pulse stream.

The clock recovery system also includes an electrical detector having an electrical input that is electrically coupled to the active layer. In addition, the clock recovery system includes a feedback control network having an input electrically coupled to the output of the detector and having an output coupled to the optical pulse generator. The feedback control network may have an electrical or an optical output.

A method of electrooptical bit phase sensing includes providing a semiconductor diode having an active layer, a first input, and a second input. A first and a second overlapping pulse stream are introduced into the first and the second input of the active layer, respectively. A detector electrically coupled to the active layer measures an output electrical signal that has a voltage proportional to the first and a second overlapping pulse stream.

Although the above bit phase sensors are described as having a first optical beam input and a control optical beam input, the inputs to the bit phase sensors are symmetrical.

Equivalents

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A system comprising:
   an electrooptical bit phase sensor including:
   a) a semiconductor diode having an active layer, a first input, and a second input, the first and second input introducing a first and a second overlapping pulse stream, respectively, into the active layer; and
   b) a detector electrically coupled to the active layer.

2. The system of claim 1 further comprising:
   a) at least one network optical fiber; and
   b) a clock recovery system optically coupled to the at least one network optical fiber comprising:
   the semiconductor diode;
   an optical pulse generator optically coupled to the second input for generating the second optical pulse stream;
   the detector, and
   a feedback control network having an input electrically coupled to the output of the detector and having an output electrically coupled to the optical pulse generator.

3. A method of electrooptical bit phase sensing comprising:
   a) providing a semiconductor diode having an active layer, a first input, and a second input;
   b) introducing a first and a second overlapping pulse stream into the first and second input of the active layer, respectively; and
   c) detecting a voltage across the active layer that is proportional to the first and second overlapping pulse stream.

* * * * *